United States Patent
Chung et al.

(10) Patent No.: US 9,583,472 B2
(45) Date of Patent: Feb. 28, 2017

(54) FAN OUT SYSTEM IN PACKAGE AND METHOD FOR FORMING THE SAME

(71) Applicant: Apple Inc., Cupertino, CA (US)

(72) Inventors: Chih-Ming Chung, Cupertino, CA (US); Jun Zhai, Cupertino, CA (US); Yizhang Yang, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/637,109

(22) Filed: Mar. 3, 2015

(65) Prior Publication Data

US 2016/0260695 A1    Sep. 8, 2016

(51) Int. Cl.
*H01L 25/18* (2006.01)
*H01L 21/56* (2006.01)
(Continued)

(52) U.S. Cl.
CPC ............ *H01L 25/18* (2013.01); *H01L 21/565* (2013.01); *H01L 21/768* (2013.01); *H01L 23/3107* (2013.01); *H01L 23/34* (2013.01); *H01L 23/3675* (2013.01); *H01L 23/481* (2013.01); *H01L 23/5386* (2013.01); *H01L 23/5389* (2013.01); *H01L 23/552* (2013.01); *H01L 24/14* (2013.01); *H01L 24/19* (2013.01); *H01L 24/32* (2013.01); *H01L 24/97* (2013.01); *H01L 25/0652* (2013.01); *H01L 25/16* (2013.01); *H01L 25/50* (2013.01); *H01L 21/568* (2013.01); *H01L 2224/0401* (2013.01); *H01L 2224/04105* (2013.01); *H01L 2224/12105* (2013.01); *H01L 2224/131* (2013.01); *H01L 2224/13024* (2013.01); *H01L 2224/13144* (2013.01); *H01L 2224/16227* (2013.01); *H01L 2224/2732* (2013.01); *H01L 2224/27318* (2013.01); *H01L 2224/27436* (2013.01); *H01L 2224/32145* (2013.01); *H01L 2224/32225* (2013.01);
(Continued)

(58) Field of Classification Search
CPC ..... H01L 25/18; H01L 21/565; H01L 21/768; H01L 23/3107; H01L 23/3675; H01L 23/481; H01L 23/5386; H01L 24/14; H01L 24/32; H01L 25/50; H01L 23/34; H01L 23/5389; H01L 23/552; H01L 24/19; H01L 24/97; Y01L 25/16
See application file for complete search history.

(56) References Cited

U.S. PATENT DOCUMENTS 7,763,976 B2    7/2010  Tang et al.
8,531,032 B2    9/2013  Yu et al.
(Continued)

OTHER PUBLICATIONS

Invitation to Pay Additional Fees for International Application No. PCT/US2016018801, mailed May 27, 2016, 10 pages.
(Continued)

*Primary Examiner* — Long Pham
(74) *Attorney, Agent, or Firm* — Blakely, Sokoloff, Taylor & Zafman LLP

(57) ABSTRACT

Packages and methods of formation are described. In an embodiment, a system in package (SiP) includes first and second redistribution layers (RDLs), stacked die between the first and second RDLs, and conductive pillars extending between the RDLs. A molding compound may encapsulate the stacked die and conductive pillars between the first and second RDLs.

18 Claims, 11 Drawing Sheets

(51) Int. Cl.
  *H01L 21/768* (2006.01)
  *H01L 23/31* (2006.01)
  *H01L 23/367* (2006.01)
  *H01L 23/48* (2006.01)
  *H01L 23/538* (2006.01)
  *H01L 23/00* (2006.01)
  *H01L 25/065* (2006.01)
  *H01L 25/00* (2006.01)
  *H01L 23/34* (2006.01)
  *H01L 23/552* (2006.01)
  *H01L 25/16* (2006.01)

(52) U.S. Cl.
  CPC ......... *H01L 2224/73204* (2013.01); *H01L 2224/73253* (2013.01); *H01L 2224/73267* (2013.01); *H01L 2224/81005* (2013.01); *H01L 2224/81203* (2013.01); *H01L 2224/81815* (2013.01); *H01L 2224/82031* (2013.01); *H01L 2224/82039* (2013.01); *H01L 2224/83005* (2013.01); *H01L 2224/83191* (2013.01); *H01L 2224/83855* (2013.01); *H01L 2224/83862* (2013.01); *H01L 2224/83874* (2013.01); *H01L 2224/92225* (2013.01); *H01L 2224/92244* (2013.01); *H01L 2224/94* (2013.01); *H01L 2224/97* (2013.01); *H01L 2225/06548* (2013.01); *H01L 2225/06555* (2013.01); *H01L 2225/06589* (2013.01); *H01L 2924/12* (2013.01); *H01L 2924/14* (2013.01); *H01L 2924/1431* (2013.01); *H01L 2924/1433* (2013.01); *H01L 2924/1434* (2013.01); *H01L 2924/1436* (2013.01); *H01L 2924/15311* (2013.01); *H01L 2924/19011* (2013.01); *H01L 2924/19041* (2013.01); *H01L 2924/19042* (2013.01); *H01L 2924/19103* (2013.01); *H01L 2924/19104* (2013.01); *H01L 2924/19105* (2013.01); *H01L 2924/3025* (2013.01); *H01L 2924/3511* (2013.01)

(56) References Cited

U.S. PATENT DOCUMENTS

| | | |
|---|---|---|
| 8,669,140 B1 | 3/2014 | Muniandy et al. |
| 8,729,714 B1 | 5/2014 | Meyer |
| 8,796,139 B2 | 8/2014 | Ramasamy et al. |
| 8,822,268 B1 | 9/2014 | Mangnus |
| 8,890,329 B2 | 11/2014 | Kim et al. |
| 2007/0246806 A1 | 10/2007 | Ong et al. |
| 2013/0037950 A1* | 2/2013 | Yu .............. H01L 23/49816 257/738 |
| 2013/0154091 A1 | 6/2013 | Wright et al. |
| 2014/0239497 A1 | 8/2014 | Yap |
| 2015/0303174 A1 | 10/2015 | Yu et al. |

OTHER PUBLICATIONS

PCT International Search Report and Written Opinion for International Application No. PCT/US2016/018801, mailed Sep. 7, 2016, 21 pages.

* cited by examiner

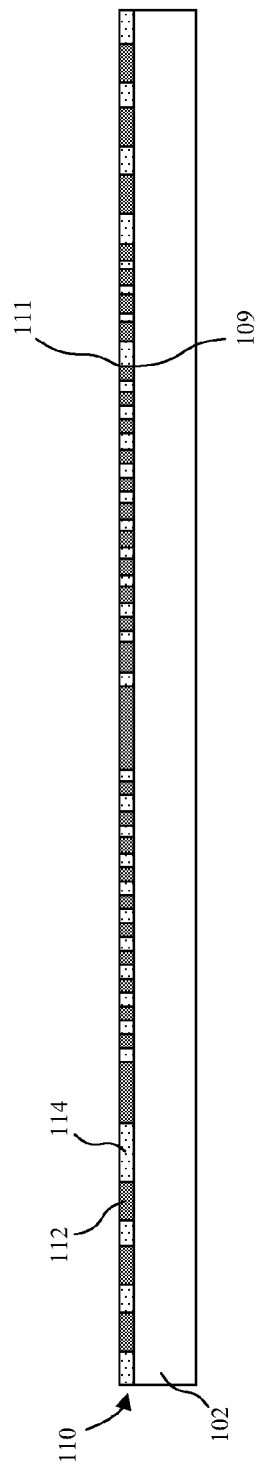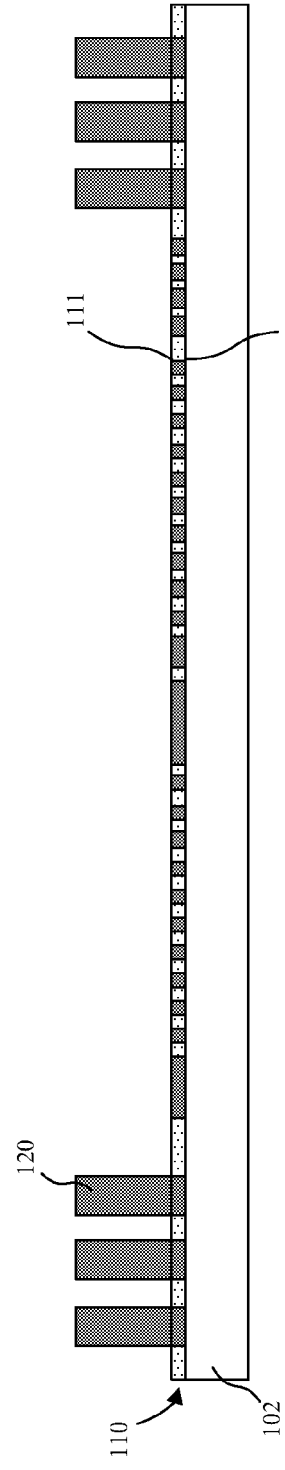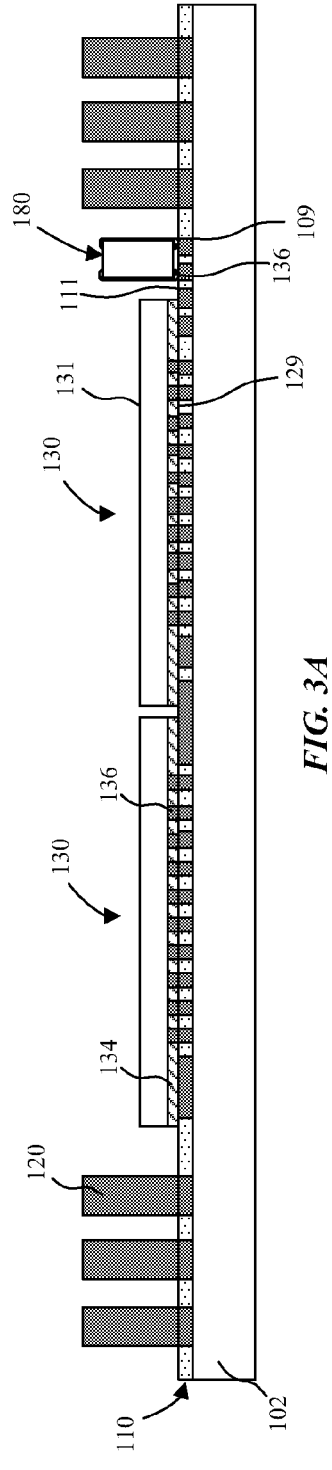
FIG. 1
FIG. 2
FIG. 3A

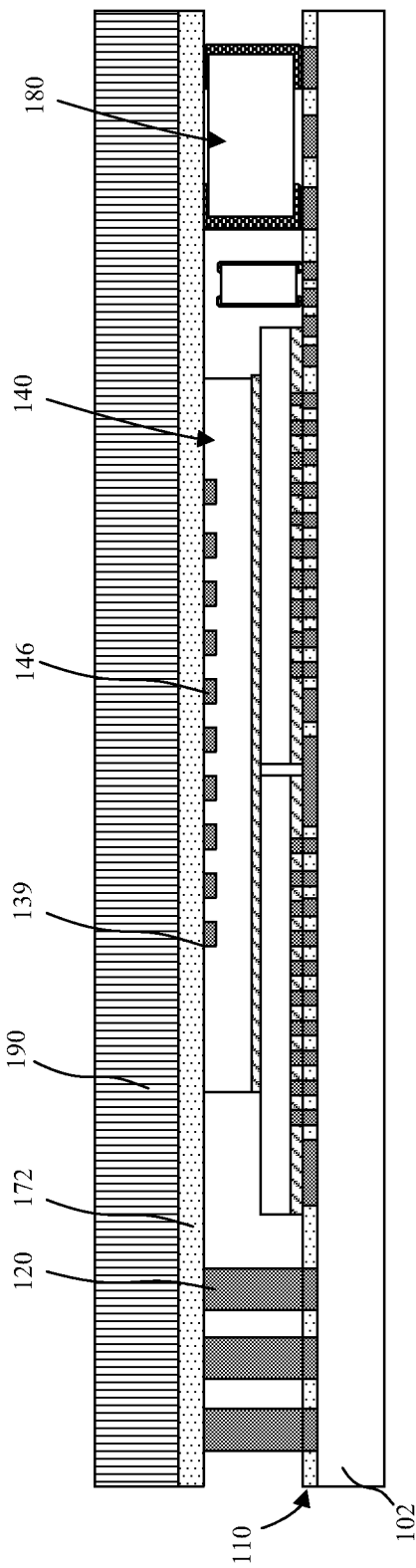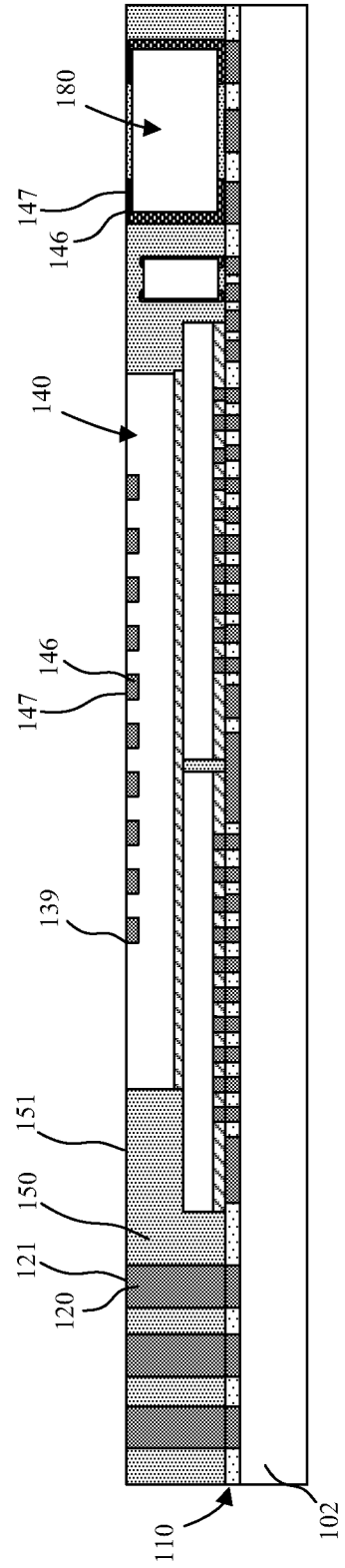
FIG. 6B
FIG. 6C

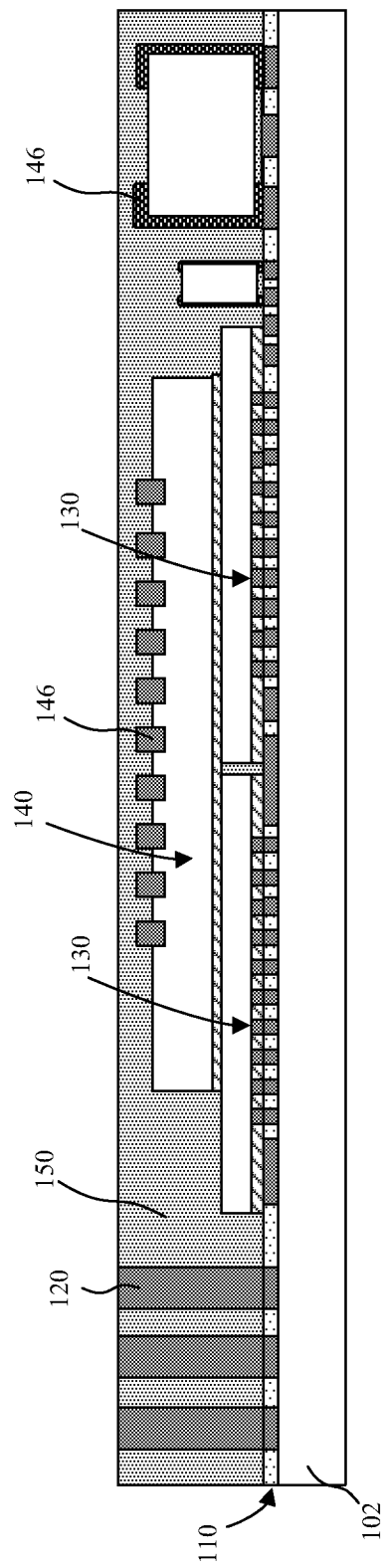
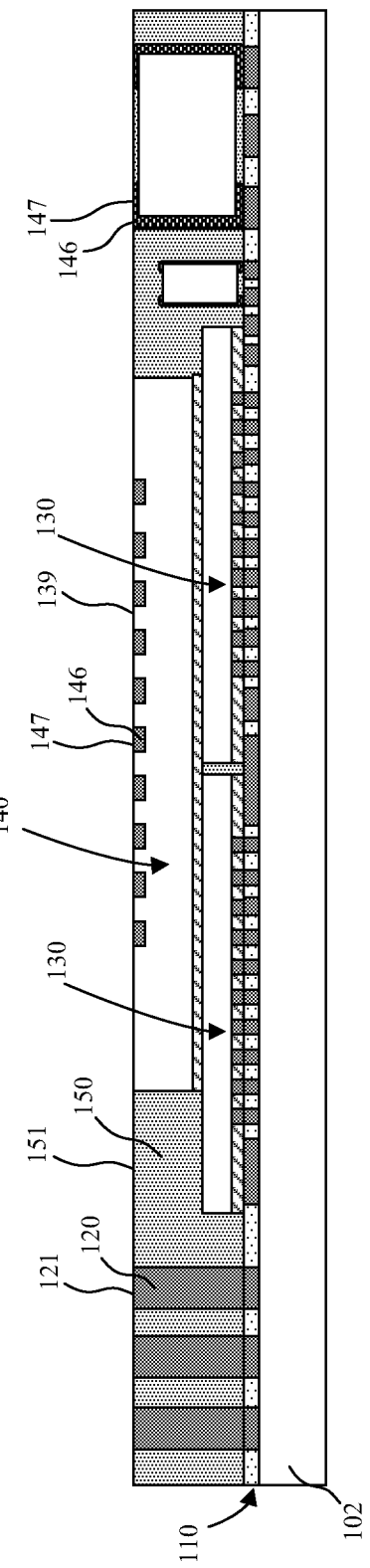
FIG. 7A
FIG. 7B

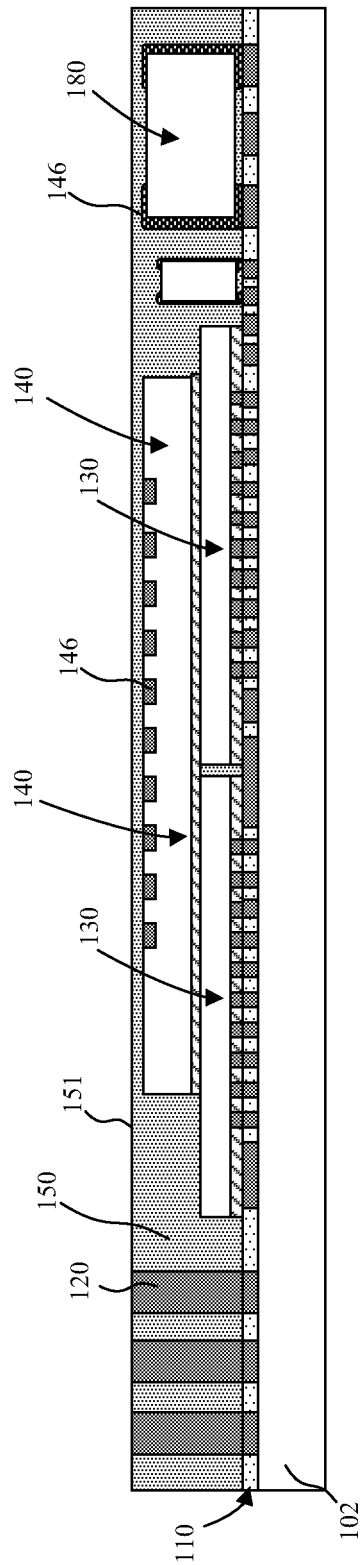
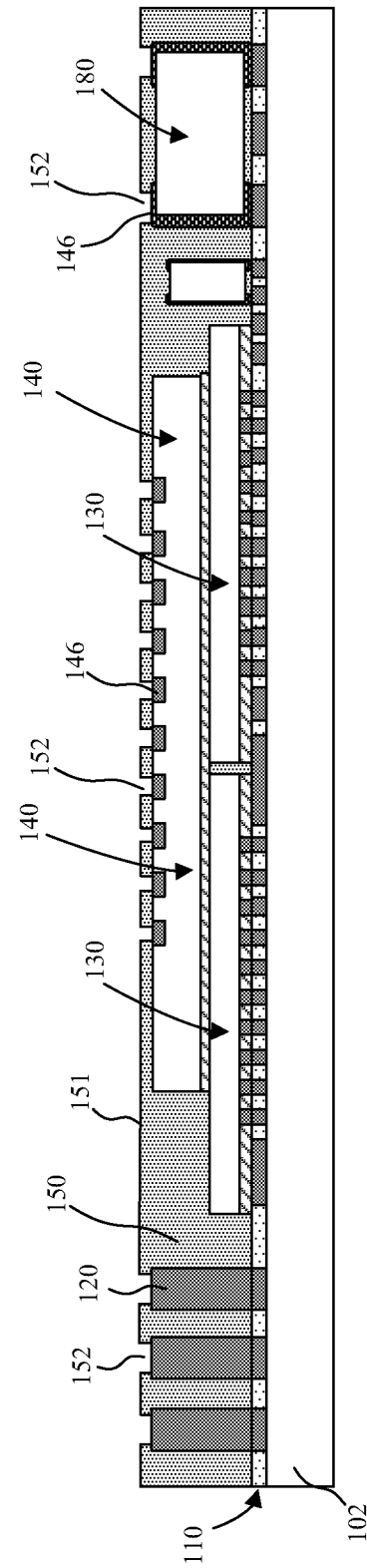
FIG. 8A
FIG. 8B

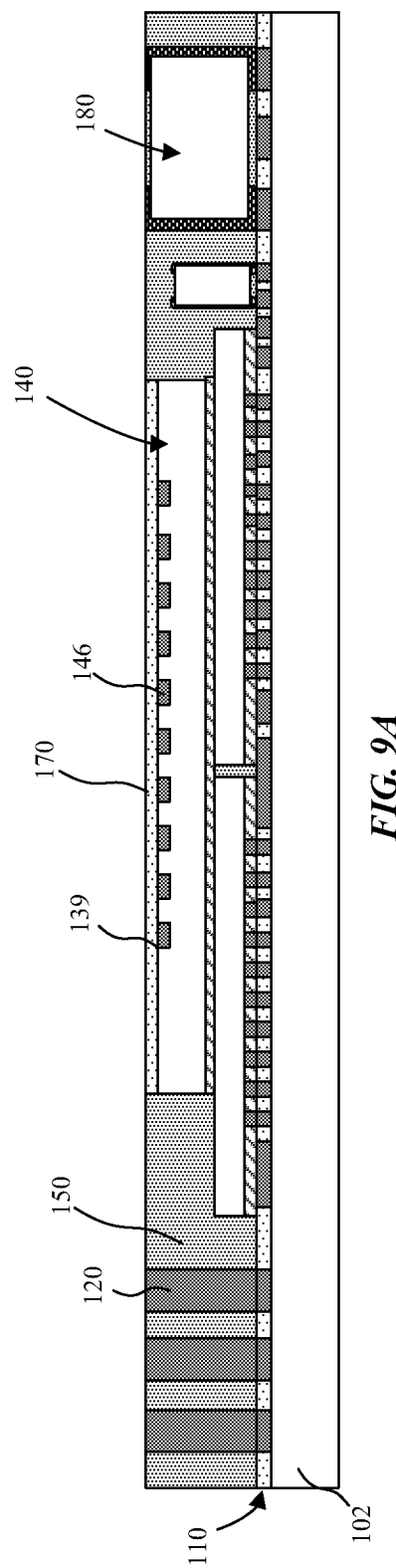
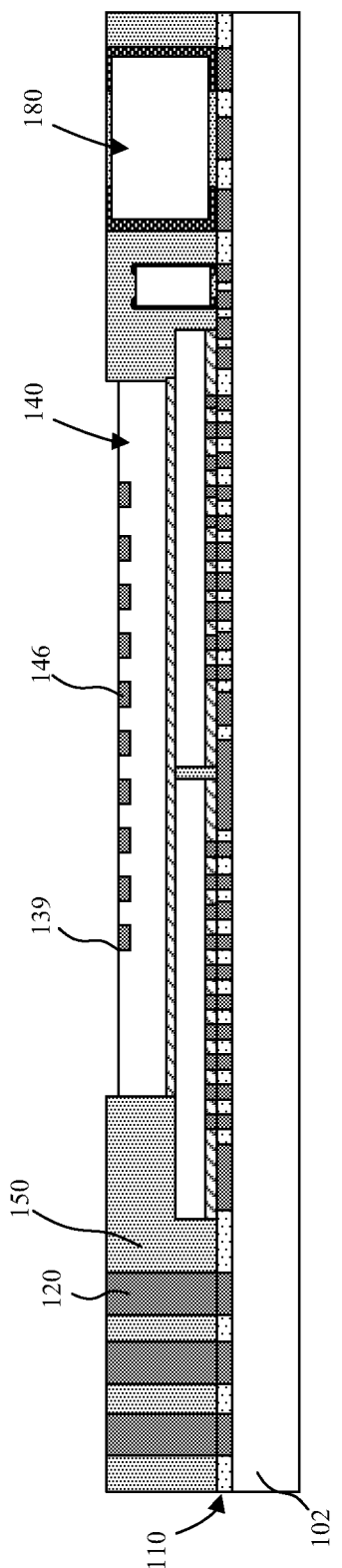
FIG. 9A
FIG. 9B

FAN OUT SYSTEM IN PACKAGE AND METHOD FOR FORMING THE SAME

BACKGROUND

Field

Embodiments described herein relate to semiconductor packaging. More particularly embodiments relate to fan out system in packages (SiPs).

Background Information

The current market demand for portable and mobile electronic devices such as mobile phones, personal digital assistants (PDAs), digital cameras, portable players, gaming, and other mobile devices requires the integration of more performance and features into increasingly smaller spaces. As a result, various multiple-die packaging solutions such as system in package (SiP) and package on package (PoP) have become more popular to meet the demand for higher component density devices.

System in package (SiP) structures typically include two or more dissimilar die in a single package as a functional system or sub-system. For example, logic and memory may be combined into a single package, along with other components such as passive devices, MEMS devices, sensors, etc. The die within a SiP can be stacked vertically or arranged horizontally on a carrier. The die are commonly connected with off-chip wire bonds or solder bumps. A SiP may be assembled on an interposer to fan out electrical terminals for an integrated product.

More recently, package on package (PoP) structures have become increasingly popular. PoP technology generally involves the installation of two or more packages on top of each other with a standard interface to rout signals between them. High component density devices may commonly have a memory package installed on top of a logic package or system on chip (SoC) package. Common PoP structures include an interposer between the top and bottom packages to fan out electrical terminals.

SUMMARY

In an embodiment, a package includes a first redistribution layer (RDL) with a first interior side and first exterior side, and a first die bonded to the first interior side of the first RDL. A second RDL also including a second interior side and second exterior side is under the first RDL, and a second die is bonded to the second interior side of the second RDL. A plurality of conductive pillars extends from the first interior side of the first RDL to the second interior side of the second RDL. A molding compound is located between the first interior side of the first RDL and the second interior side of the second RDL, and encapsulates the plurality of conductive pillars, the first die, and the second die between the first interior side and the second interior side. The molding compound may be a continuous layer of uniform composition between the first interior side of the first RDL and the second interior side of the second RDL and encapsulating the plurality of the conductive pillars the first die, and the second die.

In an embodiment, the package is a fan out system in package (SiP) structure in which the first die is a memory device, and the second die is a logic device. The package may include a plurality of conductive bumps (e.g. solder bumps) on the second exterior side of the second RDL, for example, for integration onto a printed circuit board. The package may include additional integration. For example, a device can be bonded to the first exterior side of the first RDL. Exemplary devices include a lid, heat spreader, passive components, and integrated circuit die.

In accordance with embodiments, the first die is stacked on the second die and the first die is not directly electrically coupled with the second die. For example, the first die may be attached to the second die with a die attach film or thermal enhanced tape. In such a configuration, the first die may communicate with the second die, or vice versa, through the first and second RDLs and conductive pillars. In an embodiment, the first die includes a front side with contact pads and a back side that does not include contact pads, and the second die includes a front side with contact pads and a back side that does not include contact pads. In such a configuration, the front side of the first die is bonded to the first RDL, and the front side of the second die is bonded to the second RDL. In an embodiment, the back side of the first die faces the back side of the second die. The back side of the first die may be attached to the back side of the second die with a die attach film.

Embodiments describe various multiple die stacking configurations. In an embodiment, a third die is bonded to the second interior side of the second RDL, where the first die is stacked on both the second die and the third die. In an embodiment, a fourth die is bonded to the first interior side of the first RDL. In an embodiment, the first die and the fourth die are attached to the second die, and the first die and the fourth die together occupy a larger area than the second die. The first die and the fourth die may be attached to the second die with a die attach film on a back side of the second die. The third die may alternatively be a passive component.

In an embodiment, a passive component is bonded to the first interior side of the first RDL. For example, the passive component may be surface mounted on the first interior side of the first RDL. In one configuration, the passive component is bonded to both the first interior side of the first RDL and the second interior side of the second RDL. For example, the passive component may be integrated as a part of a pattern of the plurality of conductive pillars, such as a pattern forming a periphery around the die stack.

In an embodiment, the second RDL includes a redistribution line formed directly on a contact pad of the second die. The second RDL may additional include a redistribution line formed directly on a conductive pillar. In an embodiment, a conductive bump on the first die is bonded to a contact pad of the first RDL. For example, such a configuration may be consistent with flip chip bonding, thermal compression, and the use of various conductive and non-conductive layers. A layer such as a non-conductive paste (NCP) or non-conductive film (NCF) may optionally laterally surrounds the conductive bump. In an embodiment, an anisotropic conductive film is directly between the conductive bump on the first die and the contact pad of the first RDL.

In an embodiment, a method of forming a fan out system in package includes forming a first redistribution layer on a carrier substrate, forming a plurality conductive pillars (for example by plating or implanting copper columns on the first redistribution layer), attaching a first die to the first redistribution layer inside a perimeter of the plurality of conductive pillars, stacking a second die on the first die, encapsulating the second die, the first die, and the plurality of conductive pillars in a molding compound, and forming a second redistribution layer on the molding compound, the second die, and the plurality of conductive pillars. In accordance with embodiments, a variety of operation may be performed to expose or condition the second die and plurality of conductive pillars prior to forming the second RDL.

In an embodiment, a thickness of the molding compound and the plurality of conductive pillars is reduced after encapsulating the second die, the first die, and the plurality of conductive pillars in the molding compound, and prior to forming the second RDL. In an embodiment, openings are formed in the molding compound to expose lading pads on the second die prior to forming the second RDL. In an embodiment, a protective film is removed from the second die to expose lading pads on the second die after encapsulating the second die, the first die, and the plurality of conductive pillars in the molding compound, and prior to forming the second RDL.

BRIEF DESCRIPTION OF THE DRAWINGS

FIG. 1 is a cross-sectional side view illustration of a first RDL on a carrier substrate in accordance with an embodiment.

FIG. 2 is a cross-sectional side view illustration of a plurality of pillars formed on a first RDL in accordance with an embodiment.

FIGS. 3A-3B are cross-sectional side view illustrations of a plurality of die and a component bonded to a first RDL in accordance with embodiments.

FIGS. 6B-6C are cross-sectional side view illustrations of a molding and release film removal procedure in accordance with an embodiment FIGS. 7A-7B are cross-sectional side view illustrations of a molding and grind-back procedure in accordance with an embodiment.

FIGS. 8A-8B are cross-sectional side view illustrations of a molding and patterning procedure in accordance with an embodiment.

FIGS. 9A-9B are cross-sectional side view illustrations of a molding and sacrificial layer removal procedure in accordance with an embodiment.

DETAILED DESCRIPTION

Figure 3B:
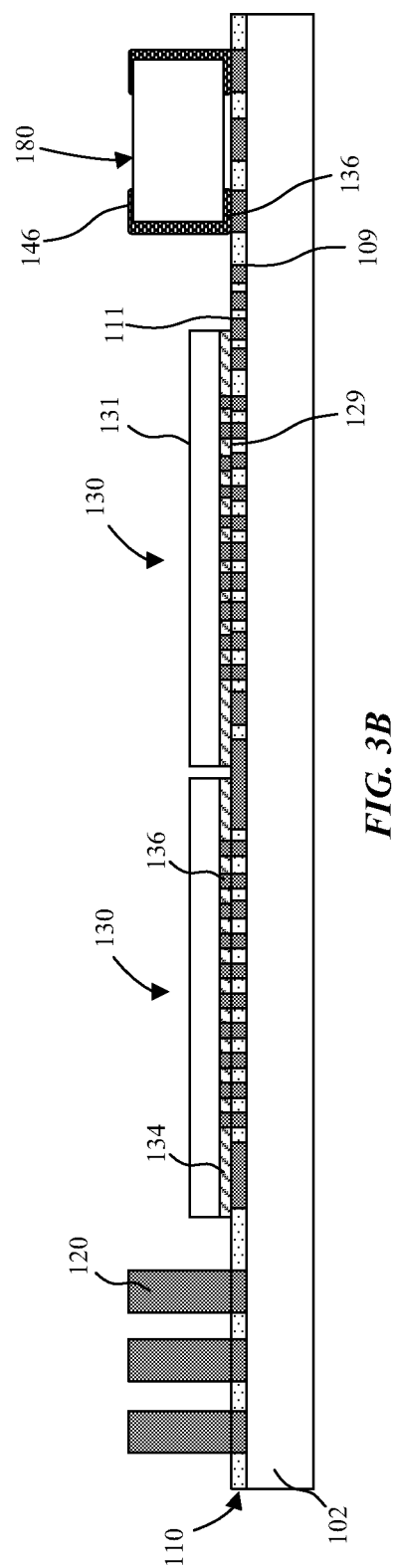

Embodiments describe fan out system in package (SiP) structures and methods of manufacture. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers. The singular term "die" as used herein is equivalent to the singular term "chip."

In one aspect, embodiments describe SiP structures that leverage redistribution layers (RDLs) for the fan out of electrical terminals of stacked die. Specifically, in an embodiment a stacked die arrangement includes a top die bonded to a top side redistribution layer (RDL) for fan out, and a bottom die bonded to a bottom side RDL for fan out, with the top and bottom RDLs integrated with each other through conductive pillars as vertical conductors extending between the top RDL and bottom RDL. Thus, embodiments describe a SiP structure with a two sided RDL arrangement. Such a configuration may allow for fan out of each individual die with a corresponding RDL. Furthermore, such a configuration may allow for dissimilar die integration such as logic/memory (e.g. ASIC/DRAM) without additional silicon or organic interposers commonly used in PoP and SiP integration.

In other aspects, embodiments describe a two sided RDL arrangement that disconnects a thickness correlation of die to vertical conductors commonly found in PoP solutions, where such a thickness correlation describes a standoff height between the bottom die and bottom surface of the top package. This may be attributed to the ability of embodiments to integrate die stacking with direct chip-to-chip attachment of the die between the top RDL and bottom RDL. Furthermore, embodiments describe a two sided RDL arrangement with direct chip-to-chip attachment that can reduce overall package thickness. For example, use of an RDL for fan out as opposed to an interposer can contribute to an overall package thickness reduction. Additionally, embodiments may allow for adoption of thinner die, with contact pads on a single side of the die bonded to a corresponding RDL.

In another aspect, direct chip-to-chip attachment can be achieved without pre-packaging processes such as solder reflow, thus alleviating mechanical and warpage concerns associated with solder reflow commonly associated with chip-to-chip attachment in many SiP applications, or package-to-package attachment in many PoP applications.

Referring now to FIG. 1 a cross-sectional side view illustration is provided of a first redistribution layer (RDL) 110 formed on a carrier substrate 102, such as a wafer or panel (e.g. glass). The first RDL 110 may include single or multiple redistribution lines 112. In an embodiment, first RDL 110 includes embedded redistribution lines 112 (embedded traces). For example, the redistribution lines 112 may be created by first forming a seed layer, followed by forming a metal (e.g. copper) pattern. Alternatively, redistribution lines may be formed by deposition (e.g. sputtering) and etching. The material of redistribution lines 112 can include, but are not limited to, a metallic material such as copper, titanium, nickel, gold, and combinations or alloys thereof. The metal pattern of the redistribution lines 112 is then embedded in a dielectric layer 114, which is optionally patterned. The dielectric layer 114 may be any suitable material such as an oxide, or polymer (e.g. polyimide). The exposed portions of the redistribution lines 112 may correspond to contact pads of the first RDL 110 for die bonding, or seed layers for growth of conductive pillars. The first RDL 110 may include a single redistribution line 112 or multiple redistribution lines 112 and dielectric layers 114. The first RDL 110 may be formed by a layer-by-layer process, and may be formed using thin film technology. In accordance with embodiments, the first RDL 110 may have a thickness that is less than conventional organic or laminate substrates. For example, a conventional six layer organic or laminate substrate may have a thickness of 300 µm-500 µm. Thickness of the first RDL 110 may be determined by the number of conductive redistribution lines 112 and dielectric layers 114 as well as the manner for formation. In accordance with embodiments, conductive redistribution lines may have a thickness of approximately 3-10 µm, and dielectric layers have a thickness of 2-5 µm. The RDLs in accordance with embodiments may additionally allow for narrower line spacing width (fine pitch) and thinner lines compared to conventional organic or laminate substrates. In an embodiment, the first RDL 110 has total a thickness of less than 50 µm, or more specifically approximately 30 µm or less, such as approximately 20 µm. In an embodiment, the exterior side 109 of the first RDL 110 is formed of a dielectric layer 114 for passivation of the first RDL 110. In some embodiments, the outer-most dielectric layer 114 may be opened up for further package integration. In some embodiments, the outer-most layer of the first RDL is a metal layer for heat dissipation or electromagnetic interference (EMI) shielding. Various structural configurations are described below.

The formation of conductive pillars 120 is illustrated in FIG. 2. Conductive pillars 120 may be formed using a suitable processing technique, and may be formed of a variety of suitable materials (e.g. copper) and layers. In an embodiment, conductive pillars 120 are formed by a plating technique, such as electroplating using a patterned photoresist layer to define the pillar structure dimensions, followed by removal of the patterned photoresist layer. The material of conductive pillars 120 can include, but is not limited to, a metallic material such as copper, titanium, nickel, gold, and combinations or alloys thereof. In an embodiment, conductive pillars 120 are formed by implanting copper columns on the first RDL.

Referring now to FIGS. 3A-3B, one or more die 130, and optionally components 180 are bonded to the first RDL 110. For example, components 180 may be passive components such as a capacitor or inductor. In the embodiments illustrated, a plurality of die 130 are bonded to the interior side 111 of the first RDL within a periphery of the plurality of conductive pillars 120. In an embodiment, the first die 130 includes a first side 129 with contact pads 136 and a back side 131 that does not include contact pads. The first side 129 may additionally include passivation layer 134 surrounding the contact pads. As illustrated, the front side 129 of the first die 130 is bonded to the first RDL 110. The specific type of die 130 may depend upon the particular application. For example, die 130 may be logic, memory, or other components. Different types of die 130 may be bonded to the first RDL 110. In the embodiment illustrated in FIG. 3A the die 130 and component 180 are surface mounted on the interior side 111 of the first RDL 110. As shown, the component 180 may also be located within a periphery of the plurality of conductive pillars 120. In the embodiment illustrated in FIG. 3B the component 180 is illustrated as replacing one or more of the conductive pillars in the pattern of conductive pillars 120, though this is not required. Thus, the component 180 may be integrated as a part of a pattern of the conductive pillars 120, such as a pattern surrounding the die 130, and any additional die or components that are subsequently attached to the die 130. In the embodiment illustrated in FIG. 3B, the component 180 can be bonded to both the first RDL 110 and second RDL 210, yet to be formed. Thus, in accordance with FIGS. 3A-3B, passive components such as capacitors or inductors can be surface mounted on the first RDL 110 close to the die 130, without compromising package z-height.

Figure 4A:
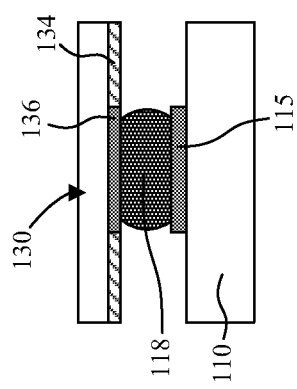
FIG. 4A is a close-up cross-sectional side view illustration of a die bonded to a first RDL with a conductive bump in accordance with an embodiment.
Figure 4B:
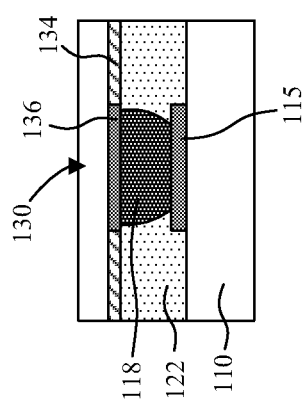
FIG. 4B is a close-up cross-sectional side view illustration of a die bonded to a first RDL with a conductive bump and non-conductive layer in accordance with an embodiment.
Figure 4C:
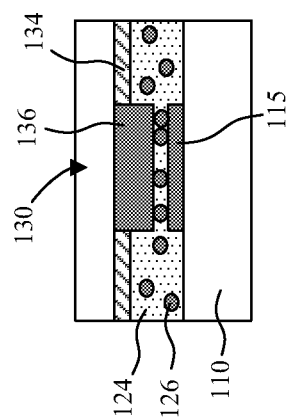
FIG. 4C is a close-up cross-sectional side view illustration of a die bonded to a first RDL with a conductive bump and an anisotropic conductive film in accordance with an embodiment.

Bonding may be accomplished using a variety of techniques. For example, the die 130 or components 180 may be attached using a flip chip method. In the embodiment illustrated in FIG. 4A, the contact pads 136 of die 130 or components 180 are bonded to contact pads 115 of the first RDL 110 using conductive bumps 118, such as a solder material. Thermal distortion issues associated with solder reflow may be dampened at this stage due to the presence of the carrier substrate 102. In the embodiment illustrated in FIG. 4B, die 130 or component 180 is bonded to the first RDL 110 with a conductive bump 118 and a non-conductive paste (NCP) or non-conducive film (NCF) 122 that laterally surrounds the conductive bump 118. In such an embodiment, bonding may be accomplished using thermal compression to bond the conductive bump 118 to contact pad 115. Conductive bump 118 may be formed of a material that can diffuse with contact pad 115, such as gold or solder material. In an embodiment illustrated in FIG. 4C, die 130 or component 180 is bonded to the first RDL 110 with an anisotropic conductive film (ACF) 124 directly between a conductive bump 118 on the first die and the contact pad 115 of the first RDL 110. In such an embodiment, the conductive bump 118 may be a stud bump extending from the die 130. A stud bump can also, or alternatively, extend from the contact pad 115 of the first RDL 110. Conductive particles 126 within the ACF 124 can create electrical connection between the die 130 and first RDL 110 at the determined locations.

Figure 5:
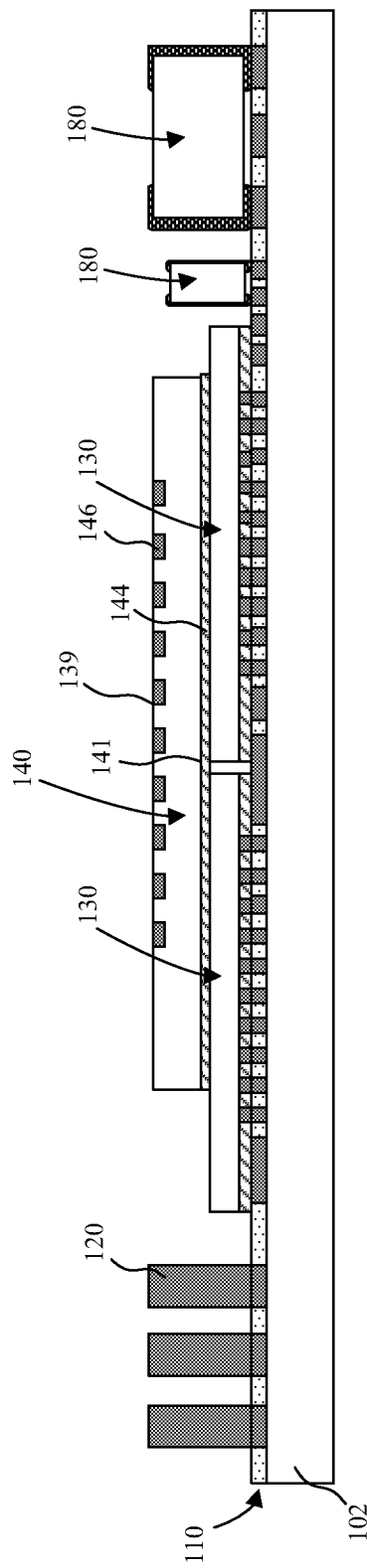
FIG. 5 is a cross-sectional side view illustration of a second die stacked on a plurality of first die in accordance with an embodiment.

In the following description, additional processing sequences are described and illustrated utilizing the embodiments illustrated in FIGS. 3A-3B. It is to be appreciated that this is exemplary, and that embodiments are not so limited. For example, embodiments may include a single component 180 from either FIG. 3A or FIG. 3B, a number of combinations of components 180, or no components 180. Referring now to FIG. 5, one or more die 140 are stacked on top of the one or more die 130 or component 180. For example, die 140 may be logic or memory. Different types of die 140 may be stacked on top of the one or more die 130 or component 180. Furthermore, the illustrated die 140 may also be replaced with other active devices or passive components. In an embodiment, a second die 140 includes a front side 139 with contact pads 146 and a back side 141 that does not include contact pads. As shown, the back side 131 of the first die 130 faces the back side 141 of the second die 140. Thus, in an embodiment the die 140 are not directly electrically coupled to the die 130 on which the die 140 are stacked. In an embodiment, back side 131 of the first die 130 is attached to the back side 141 of the second die 140 with a die attach film 144. In accordance with embodiments, the die attach film 144 may be applied to an array of second die 140 prior to singulation and stacking on the first die 130. For example, the die attach film 144 can be applied by laminating, printing or dispensing. In an embodiment, a single second die 140 is stacked on top of multiple first die 130. In such an embodiment, the die attach film 144 may span between the multiple first die 130, as illustrated in FIG. 5. In an embodiment, die attach film 144 is formed of an adhesive material. Die attach film 144 may additionally be a thermally conductive adhesive for thermal dissipation. The die attach film 144 may optionally be cured after die stacking through chemical, thermal or ultraviolet light, for example.

The stacked die and conductive pillars may then be encapsulated with a molding compound, such as a thermosetting cross-linked resin (e.g. epoxy), liquid or granule, sheet or film, though other materials may be used as known in electronic packaging. Encapsulation may be accomplished using a suitable technique such as, but not limited to, transfer or compression molding, liquid encapsulant injection and lamination. As used herein, "encapsulated" does not require all surfaces to be incased within a molding compound. For example, in the embodiment illustrated in FIG. 6A the lateral sides of die 140 and conductive pillars 120 are encased in the molding compound 150, while the molding compound is not formed over the front surface 139 of die 140, and the top surfaces of the conductive pillars 120 are exposed.

In accordance with embodiments, the first die 130 and component 180 have not previously been encapsulated on the first RDL 110 prior to encapsulation along with second die 140. In accordance with embodiments, the molding compound 150 fills the space between the first interior side 111 of the first RDL 110 and the second interior side 211 of the second RDL 210 (yet to be formed, see FIG. 10) and encapsulates the plurality of conductive pillars 120, the first die 130, and the second die 140 and optionally component 180 between the first interior side and the second interior side. As illustrated, the molding compound 150 is a continuous layer of uniform composition filling the space between the first interior side 111 of the first RDL 110 and the second interior side 211 of the second RDL 210, and encapsulating the conductive pillars 120 and die 130, 135, 140, 145. As illustrated, the molding compound 150 laterally surrounds each of the conductive pillars 120 and die 130, 135, 140, 145 and is also located laterally between adjacent die.

Figure 6A:
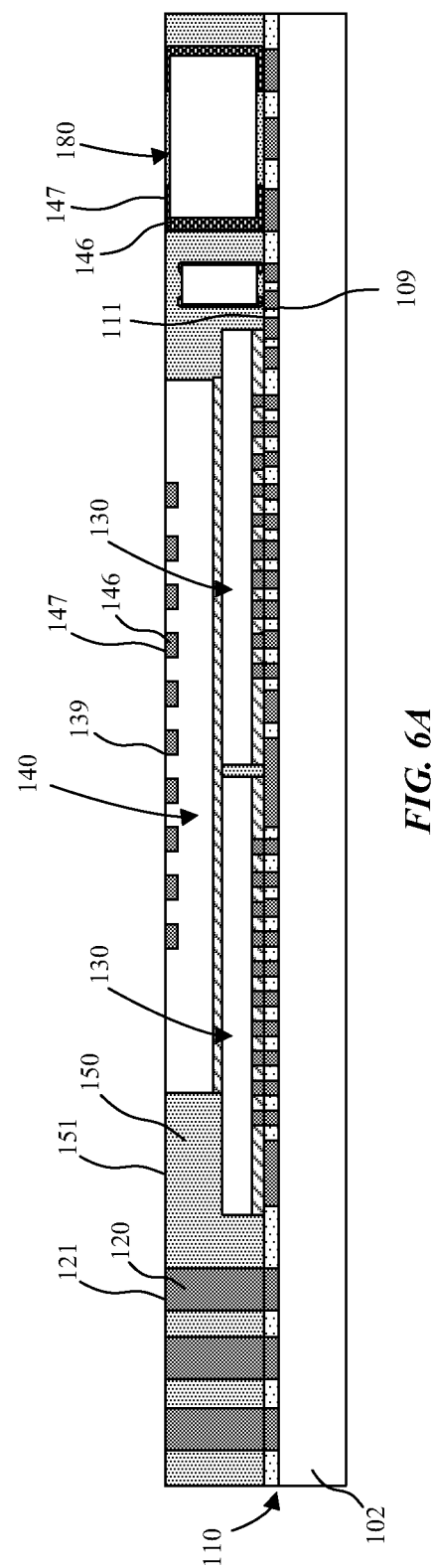
FIG. 6A is a cross-sectional side view illustration of an encapsulated die stack in accordance with an embodiment.

In the embodiment illustrated in FIG. 6A, the top surface 151 of the molding compound 150 is coplanar with the exposed surfaces 121 of the conductive pillars 120 and exposed surfaces 147 of the contact pads 146 of the die 140 and optional components 180. Control of the molding compound 150 height, and exposure of the conductive pillars 120 and contact pads 146 can be achieved in a variety of manners. For example, the top surface 151 of the molding compound can be controlled by the molding cavity used during the molding operation.

FIGS. 6B-6C are cross-sectional side view illustrations of a molding and release film removal procedure in accordance with an embodiment. As illustrated, a release film 172 can be applied to the mold tool 190 surface before the molding operation, e.g. transfer molding or liquid encapsulant injection. The release film 172 may protect the conductive pillars 120 and contact pads 146, and the front surface 139 of the die 140 and component 180 from compound or encapsulate. In an embodiment, the release film 172 has a sufficient thickness, such as 40 μm, to accommodate height variation of the die stack-up and conductive pillars. As shown in FIG. 6C, the die attach film is released after molding to expose the surfaces 121 of conductive pillars 120 and surfaces 147 of contact pads 146.

FIGS. 7A-7B are cross-sectional side view illustrations of a molding and grind-back procedure. In accordance with embodiments, a two sided RDL arrangement is described that disconnects a thickness correlation of the die to vertical conductors commonly found in PoP solutions. In some embodiments, the initial height of the conductive pillars 120 is greater than the height of the stacked die 130,140. The height of the conductive pillars 120 can then be reduced in a variety of methods. In the embodiment illustrated in FIGS. 7A-7B, the initial encapsulation operation may result in the molding compound 150 spreading over the front side 139 of the die 140, component 180, and potentially over the conductive pillars 120. The molding compound can then be processed to expose the contact pads 146 of the die 140 and optional component 180. In the embodiment illustrated in FIGS. 7A-7B, thickness of the molding compound 150 can be reduced using a grinding (e.g. chemical mechanical polishing) or etching operation. In the particular embodiment illustrated in FIG. 7B, the top surface 151 of the molding compound 150 is coplanar with the exposed surfaces 121 of the conductive pillars 120 and exposed surfaces 147 of the contact pads 146 of the die 140 and component 180. In an embodiment, the contact pads 146 may be initially in the form of chip posts (illustrated in FIG. 7A) which are then ground back, resulting in the exposed contact pads 146 (illustrated in FIG. 7B).

Embodiments are not limited to structures in which the exposed surfaces 147 of the contact pads 146 of the die 140 are coplanar with the top surface 151 of the molding compound 150. FIGS. 8A-8B are cross-sectional side view illustrations of a molding and patterning procedure. In the embodiment illustrated, the initial encapsulation operation may result in the molding compound 150 spreading over the front side 139 of the die 140, component 180, and potentially over the conductive pillars 120. Following encapsulation illustrated in FIG. 8A, the molding compound 150 is patterned as illustrated in FIG. 8B to form openings 152 to expose the surfaces 147 of the contact pads 146 of the die 140 and component, and optionally the surfaces 121 of the conductive pillars 120. Thus, rather than globally grinding or etching back, a selective patterning technique, such as laser drilling or chemical etching, can be used to expose the contact pads 146 and conductive pillars 120. FIGS. 9A-9B are cross-sectional side view illustrations of a molding and patterning procedure. In the embodiment illustrated, following encapsulation illustrated in FIG. 9A, a sacrificial layer 170 is selectively removed from the front surface 139 of the die 140 to expose the contact pads 146.

While FIGS. 6B-6C, 7A-7B, 8A-8B, and 9A-9B have been described separately, the processes are not exclusive from one another and may be combined in some embodiments.

Figure 10:
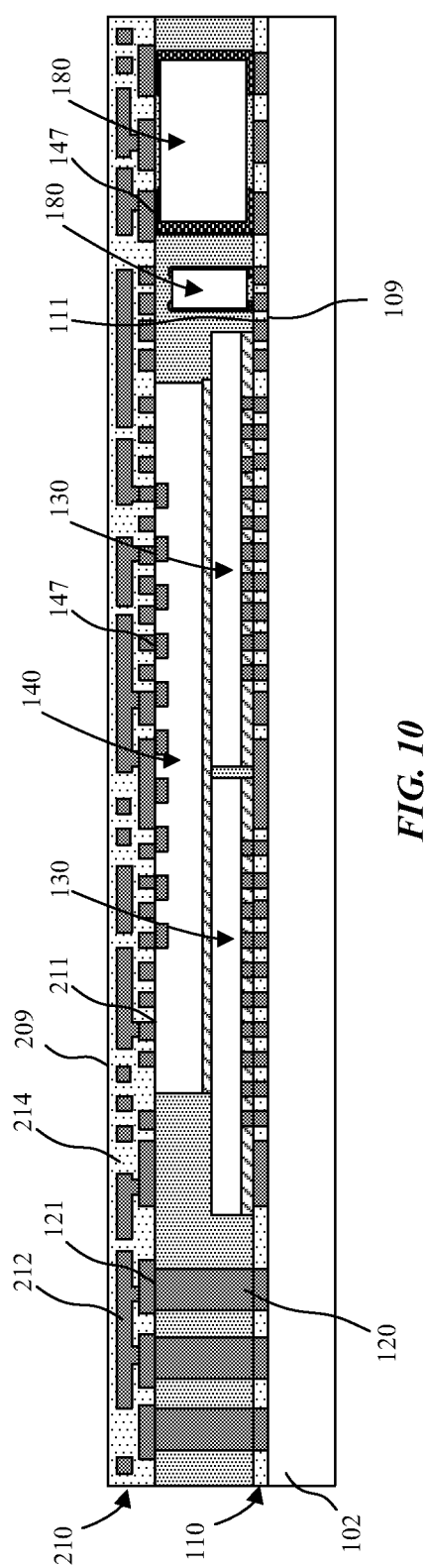
FIG. 10 is a cross-sectional side view illustration of the formation of a second RDL in accordance with an embodiment.

Referring now to FIG. 10, a second RDL 210 is formed over the top surface 151 of the molding compound 150, exposed surfaces 147 of the contact pads 146 of the die 140 and optional components 180, and the exposed surfaces 121 of the conductive pillars 120. The second RDL 210 may be formed similarly as the first RDL 110, and may include single or multiple redistribution lines 212. In an embodiment, the redistribution lines 212 are formed directly on the exposed surfaces 147 of the contact pads 146 and the exposed surfaces 121 of the conductive pillars 120. Thus, the die 140 are bonded to the second RDL 210 by virtue of the redistribution lines 212 and dielectric layers 214 that form the second RDL.

In accordance with embodiments, the two sided RDL arrangement and direct chip-to-chip die stacking arrangement illustrated in FIG. 10 allows for a reduced overall package thickness. For example, it is not necessary to include a standoff height, in which the conductive pillars 120 (vertical conductors) would be substantially taller than the die stack 130, 140 including optional component(s) 180. For example, it is not necessary to include a design tolerance to accommodate for the bonding of a top package to a bottom package with solder balls in a typical PoP solution, in which a conventional solder ball height is approximately 30-150 µm. Furthermore, the use of top and bottom RDL allows for fine line and spacing definition of the fan out of electrical terminals with a substantially lower thickness than a common interposer. The second RDL 210 may be formed by a layer-by-layer process, and may be formed using thin film technology. In accordance with embodiments, the first RDL 110 may have a thickness that is less than conventional organic or laminate substrates. For example, a conventional six layer organic or laminate substrate may have a thickness of 300 µm-500 µm. Thickness of the first RDL 110 may be determined by the number of conductive redistribution lines 112 and dielectric layers 114 as well as the manner for formation. In accordance with embodiments, conductive redistribution lines may have a thickness of approximately 3-10 µm, and dielectric layers have a thickness of 2-5 µm. The RDLs in accordance with embodiments may additionally allow for narrower line spacing width (fine pitch) and thinner lines compared to conventional organic or laminate substrates. For example, the first RDL 110 and second RDL 210 can each have a thickness of less than 50 µm, or more specifically approximately 30 µm or less, such as approximately 20 µm.

Figure 11:
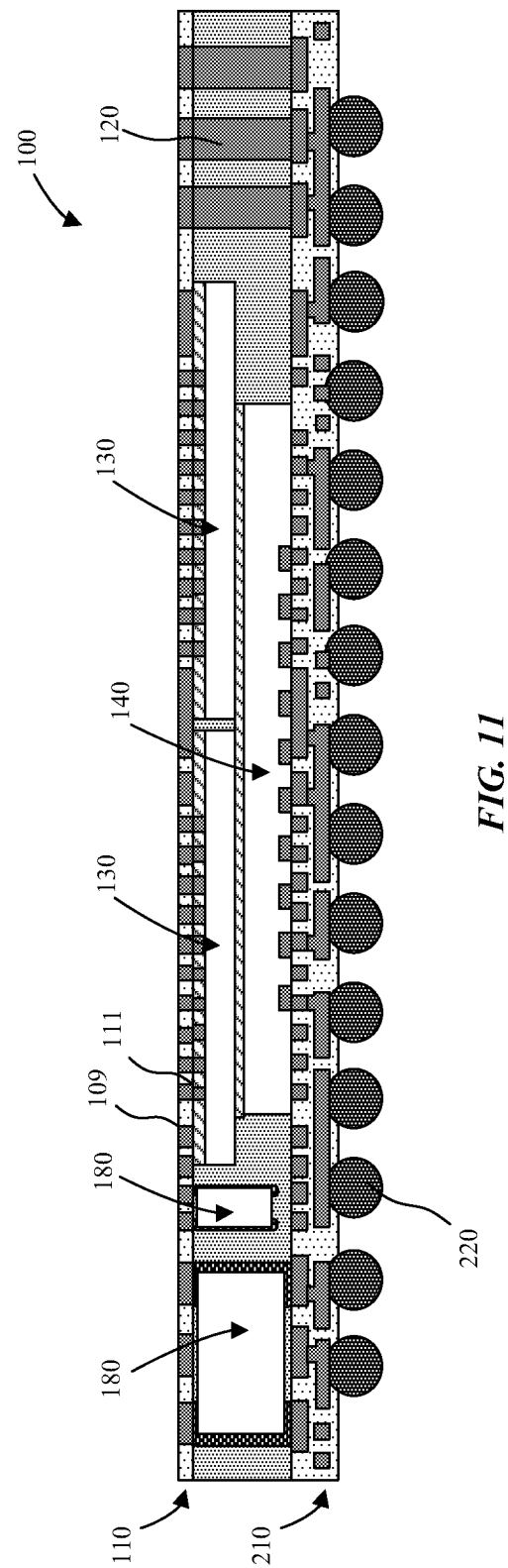
FIG. 11 is a cross-sectional side view illustration of a package with conductive bumps after removal from a carrier substrate accordance with an embodiment.

Referring now to FIG. 11, following the formation of the second RDL 210, conductive bumps 220 may be attached to or grown on the second RDL 210, the carrier substrate 102 can be released, and individual packages 100 singulated. A variety of structures can be used for conductive bumps 220. For example, the conductive bumps 220 may be attached solder balls, as illustrated, or plated pillars.

Figure 12:
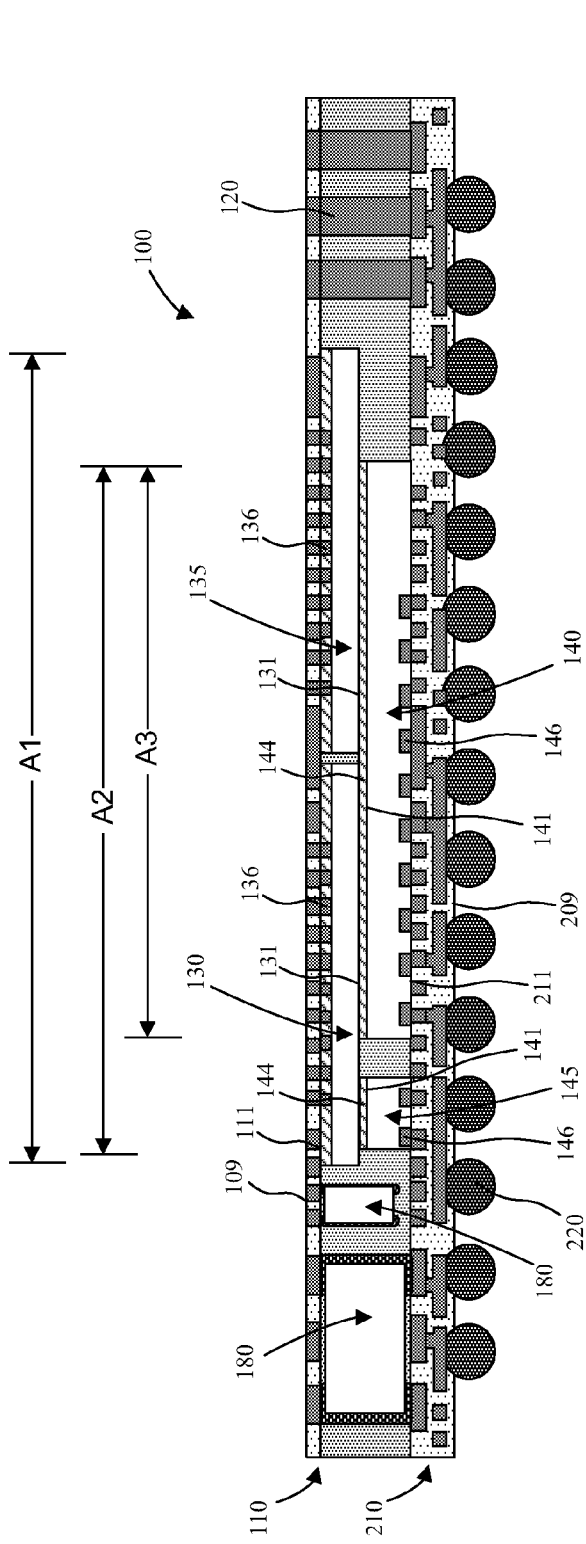
FIG. 12 is a cross-sectional side view illustration of a package including a plurality of die bonded to first and second RDLs in accordance with an embodiment.

FIG. 12 is a cross-sectional side view illustration of a package with a two sided RDL arrangement in accordance with an embodiment. As shown, the package 100 includes a first RDL 110 with a first interior side 111 and first exterior side 109. A first die 130 is bonded to the first interior side 111 of the first RDL 110. The first die 130 is stacked on a second die 140. A second RDL 210 is directly under the first RDL 110. The second RDL 210 includes a second interior side 211 and second exterior side 209. The second die 140 is bonded to the second interior side 211 of the second RDL 210. A plurality of conductive pillars 120 extend from the first interior side 111 of the first RDL 110 to the second interior side 211 of the second RDL 210. In the embodiment illustrated, a molding compound 150 fills the space between the first interior side 111 of the first RDL 110 and the second interior side 211 of the second RDL 210 and encapsulates the plurality of conductive pillars 120, the first die 130, the second die 140, and one or more components 180 between the first interior side and the second interior side. As illustrated, the molding compound 150 is a continuous layer of uniform composition filling the space between the first interior side 111 of the first RDL 110 and the second interior side 211 of the second RDL 210, and encapsulating the conductive pillars 120 and die 130, 135, 140, 145, and optional components 180. As illustrated, the molding compound 150 laterally surrounds each of the components 180, conductive pillars 120 and die 130, 135, 140, 145 and is also located laterally between adjacent die.

In accordance with embodiments, a plurality of die can be bonded to the first and second RDLs 110, 210. For example, in the embodiment illustrated in FIG. 12 a third die 145 is bonded to the second interior side 211 of the second RDL 210, and the first die 130 is stacked on both the second die 140 and third die 145. In an embodiment, a fourth die 135 is bonded to the first interior side 111 of the first RDL 110, and the fourth die 135 is stacked on the second die 140, for example, with a die attach film. In the embodiment illustrated, die 130, 135 include front sides 129 with contact pads 136 that are bonded to the first RDL 110, and die 140, 145 include front sides 139 with contact pads 146 that are bonded to the second RDL 210. In an embodiment, the back sides 131 of die 130, 135 face the back sides 141 of die 140, 145. The back sides of the die can be attached to each other by stacking, using one or more die attach films 144. Thus, in an embodiment, the back sides of the die do not include contact pads for direct electrical connection between the die that are stacked on one another. Thus, in an embodiment the die are not directly electrically coupled to the die on which they are stacked, and any electrical communication between stacked die requires communication through the RDLs 110, 210 and conductive pillars 120.

As used herein the term "stacked on" can be above or below, and is therefore does not connote a specific orientation. For example, in the embodiment illustrated FIG. 12 the first die 130 appears as being stacked on the second die 140 and third die 145. In an embodiment in which FIG. 12 is fabricated in accordance with the processing sequence illustrated in FIG. 5, the third die 145 is stacked on the first die 130, while the second die 140 is stacked on the first die 130 and on a fourth die 135 that is bonded to the first interior side 111 of the first RDL 110. Thus, the term "stacked on" can be above or below, and does not connote a specific orientation as being above or below the object on which a die is stacked.

In accordance with embodiments, a variety of dissimilar chips can be integrated into a package as a functional system or sub-system. In an embodiment, a package with a two sided RDL arrangement includes mixed logic and memory die. For example, the package 100 may include ASIC and DRAM die. In a specific embodiment die 140 is a logic die, such as an ASIC die. In an embodiment, die 130, 135 are either logic or memory (e.g. DRAM) die. In an embodiment, die 145 is replaced with a passive component. For example, die 145 may be replaced with passive component such as a silicon capacitor, inductor, or integrated passive device (IPD). Such as passive component 145 may be formed by a thin film process. In an embodiment, a majority of the thickness of a passive component 145 capacitor is silicon. Passive component 145 may be integrated differently that component 180, where passive component 145 is attached with a thermal enhanced tape or die attach film 144, as opposed to being surface mounted on the first RDL 110. Component(s) may additionally be thicker than passive component 145, and in the case of capacitors, components 180 may be designed to have a higher capacitance than passive component 145. It is to be appreciated, that the particular die configuration is exemplary and embodiments may be utilized for a variety of SiP arrangements. In accordance with some embodiments, the higher power die (e.g. ASIC) is located on the bottom of the package (e.g. as die 140) immediately adjacent the second RDL 210. In this configuration the ASIC die may be physically located closest to the conductive bumps 220. In other embodiments, the first RDL 110 is utilized as a heat spreader, in conjunction with system level. In such an embodiment, the higher power die (e.g. ASIC) is located on the top of the package (e.g. as die 130 or 135) immediately adjacent the first RDL 110. In this configuration, the top, first RDL 110 may be utilized for heat spreading capability for the higher power die.

Still referring to FIG. 12, in an embodiment the one or more die 130, 135 occupy a larger area A1 (corresponding to occupied area on the first RDL 110) than the area A2 of die 140, 145 and area A3 of die 140 (with A2 and A3 corresponding to occupied area on the second RDL 210). In the embodiment illustrated, A1>A2>A3. In one aspect, this may be attributed to the stacking process during formation of the package 100 in which die 140, 145 are stacked onto die 130, 135 similarly as described with regard to FIG. 5.

In accordance with embodiments described herein, in some applications the first RDL 110 can additionally function as a heat spreader, in conjunction with the system level. In some applications this may be suitable for spreading heat of the die 130, 135 which occupy a larger area than the die upon which they are stacked, e.g. die 140, 145. Thus, in accordance with embodiments the heat spreading capability of the top, first RDL 110 can be utilized, particularly as the area of die bonded to the top, first RDL 110 increases. Where the first RDL 110 is utilized for heat spreading ability, an outer metal layer (or redistribution line) thickness of the first RDL 110 near the exterior surface can be increased (e.g. thicker than other metal layers within the RDL 110).

Figure 13:
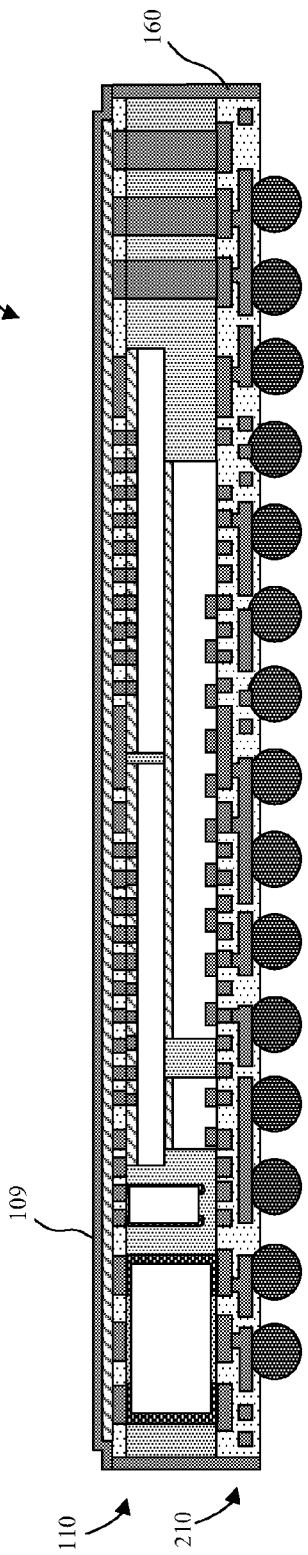
FIG. 13 is a cross-sectional side view illustration of a package including an electromagnetic interference (EMI) shielding layer in accordance with an embodiment.

Referring now to FIG. 13 a package 100 variation is illustrated in accordance with an embodiment. In the embodiment illustrated in FIG. 13, an additional metallization layer or layers 160 are optionally added for electromagnetic interference (EMI) shielding. In an embodiment, metallization layers 160 are formed around the side edges of the molding compound 150. The metallization layers 160 may additional span the exterior sides of the first RDL 110.

Figure 14:
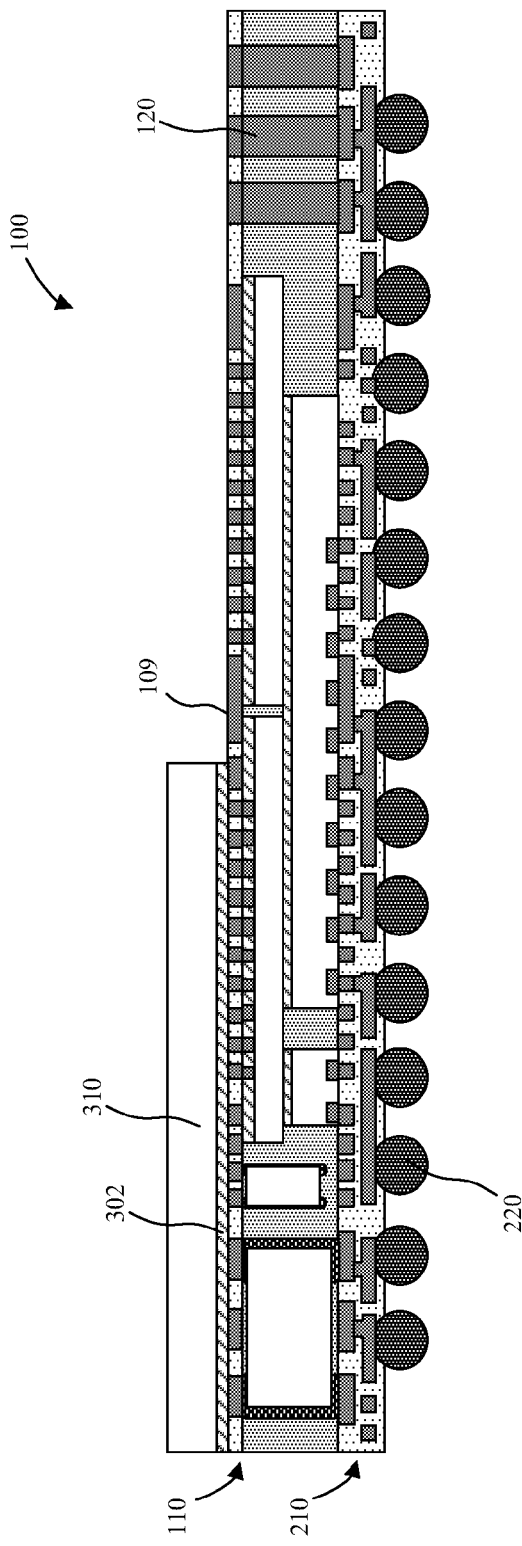
FIG. 14 is a cross-sectional side view illustration of a package including a heat spreader or lid attached to the exterior side of the first RDL in accordance with an embodiment.
Figure 15:
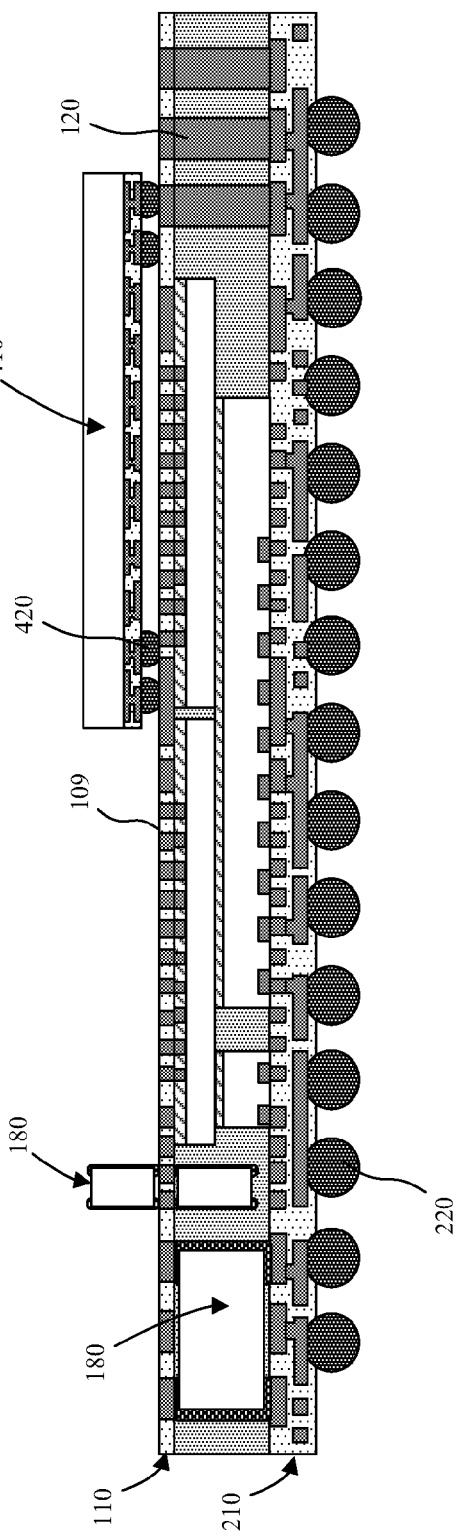
FIG. 15 is a cross-sectional side view illustration of a package including an additional die, passive component or package bonded to the exterior side of the first RDL in accordance with an embodiment.

The exterior side 109 of the first RDL 110 may additionally be opened up for interconnection with other active devices or passive components. In the embodiment illustrated in FIG. 14, a heat spreader or lid 310 is optionally attached to the exterior side 109 of the first RDL 110. For example, heat spreader or lid 310 may be attached with a thermal interface material or die attach film 302, for example. In the embodiment illustrated in FIG. 15, the integration of package 100 is further scaled by the bonding of an additional component 180 or a die or package 410 on the exterior side 109 of the first RDL 110. For example, die or package 410 may be an additional logic device. In this manner, an additional IC die can be closely located to die 140 (e.g ASIC) and electrically connected with die 140 through the first RDL 110, conductive pillars 120, and second RDL 210. In the embodiment illustrated, the die 410 is attached to the first RDL 110 with conductive bumps 420, such as solder bumps.

In utilizing the various aspects of the embodiments, it would become apparent to one skilled in the art that combinations or variations of the above embodiments are possible for forming a fan out system in package including multiple redistribution layers. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A package comprising:
   a first redistribution layer (RDL) including a first interior side and first exterior side;
   a first top die bonded to the first interior side of the first RDL;
   a second RDL under the first RDL, the second RDL including a second interior side and second exterior side;
   a bottom die bonded to the second interior side of the second RDL, wherein the first top die is stacked on the bottom die and the first top die is not directly electrically coupled with the bottom die;
   a second top die bonded to the first interior side of the first RDL, wherein the first and second top die are attached to the bottom die, and the first and second top die together occupy a larger area than the bottom die;
   a plurality of conductive pillars extending from the first interior side of the first RDL to the second interior side of the second RDL; and
   a molding compound located between the first interior side of the first RDL and the second interior side of the second RDL, wherein the molding compound encapsulates the plurality of conductive pillars, the first top die, the second top die, and the bottom die between the first interior side and the second interior side.

2. The package of claim 1, further comprising a plurality of conductive bumps on the second exterior side of the second RDL.

3. The package of claim 1, further comprising a device bonded to the first exterior side of the first RDL.

4. The package of claim 3, wherein the device is selected from the group consisting of a lid, a heat spreader, a passive component, an integrated circuit die, and an other package.

5. The package of claim 1, wherein the molding compound is a continuous layer of uniform composition between the first interior side of the first RDL and the second interior side of the second RDL and encapsulating the plurality of the conductive pillars the first top die, the second top die, and the bottom die.

6. The package of claim 1, wherein the bottom die is attached to the first and second top die with a die attach film or thermal enhanced tape.

7. The package of claim 1, wherein:
   the first top die includes a front side with contact pads and a back side that does not include contact pads;
   the bottom die includes a front side with contact pads and a back side that does not include contact pads; and
   the front side of the first top die is bonded to the first RDL, and the front side of the bottom die is bonded to the second RDL.

8. The package of claim 7, wherein the back side of the first top die faces the back side of the bottom die.

9. The package of claim 8, wherein the back side of the bottom die is attached to the back sides of the first and second top die with a die attach film.

10. The package of claim 1, further comprising a second bottom die bonded to the second interior side of the second RDL, wherein the first top die is stacked on the bottom die and the second bottom die.

11. The package of claim 1, wherein the first top die comprises a memory device, and the bottom die comprises a logic device.

12. The package of claim 1, wherein the second RDL includes a redistribution line directly on a contact pad of the bottom die.

13. The package of claim 1, wherein a conductive bump on the first top die is bonded to a contact pad of the first RDL.

14. The package of claim 13, wherein a layer selected from the group consisting of a non-conductive paste (NCP) and non-conductive film (NCF) laterally surrounds the conductive bump.

15. The package of claim 13, wherein an anisotropic conductive film is directly between the conductive bump on the first top die and the contact pad of the first RDL.

16. The package of claim 1, further comprising a passive component bonded to the first interior side of the first RDL.

17. The package of claim 16, wherein the passive component is bonded to the second interior side of the second RDL.

18. The package of claim 17, wherein the passive component is integrated as a part of a pattern of the plurality of conductive pillars.

* * * * *